(12) United States Patent
Raghu et al.

(10) Patent No.: US 8,902,661 B1
(45) Date of Patent: Dec. 2, 2014

(54) BLOCK STRUCTURE PROFILING IN THREE DIMENSIONAL MEMORY

(71) Applicant: SanDisk Technologies Inc., Plano, TX (US)

(72) Inventors: Deepak Raghu, Milpitas, CA (US); Gautam A. Dusija, Milpitas, CA (US); Chris Avila, Saratoga, CA (US); Yingda Dong, San Jose, CA (US); Man Mui, Fremont, CA (US); Alexander Kwok-Tung Mak, Los Altos Hills, CA (US); Pao-Ling Koh, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/283,912

(22) Filed: May 21, 2014

Related U.S. Application Data

(63) Continuation of application No. 14/064,823, filed on Oct. 28, 2013.

(51) Int. Cl.
| | |
|---|---|
| *G11C 16/04* | (2006.01) |
| *G11C 16/10* | (2006.01) |
| *G11C 29/00* | (2006.01) |
| G11C 16/26 | (2006.01) |
| H01L 27/115 | (2006.01) |

(52) U.S. Cl.
CPC ............... *G11C 16/10* (2013.01); *G11C 29/00* (2013.01); *G11C 16/0483* (2013.01); *G11C 16/26* (2013.01); *H01L 27/115* (2013.01)
USPC ................... 365/185.17; 365/51; 365/189.16; 365/185.05

(58) Field of Classification Search
CPC ............... G11C 16/0483; G11C 16/10; G11C 16/3418; G11C 16/26; H01L 27/115
USPC ...................... 365/185.17, 51, 189.06, 185.05
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |

(Continued)

FOREIGN PATENT DOCUMENTS

| | | |
|---|---|---|
| WO | WO 2009088920 | 7/2009 |
| WO | WO 2010030701 | 3/2010 |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Jason Lappas
(74) *Attorney, Agent, or Firm* — Davis Wright Tremaine LLP

(57) ABSTRACT

Memory hole diameter in a three dimensional memory array may be calculated from characteristics that are observed during programming. Suitable operating parameters may be selected for operating a block based on memory hole diameters. Hot counts of blocks may be adjusted according to memory hole size so that blocks that are expected to fail earlier because of small memory holes are more lightly used than blocks with larger memory holes.

20 Claims, 15 Drawing Sheets

(56) References Cited

U.S. PATENT DOCUMENTS

| | | | |
|---|---|---|---|
| 5,315,541 | A | 5/1994 | Harari et al. |
| 5,343,063 | A | 8/1994 | Yuan et al. |
| 5,570,315 | A | 10/1996 | Tanaka et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,518,919 | B2 | 4/2009 | Gonzalez et al. |
| 7,839,685 | B2 | 11/2010 | Auclair et al. |
| 8,301,912 | B2 | 10/2012 | Lin et al. |
| 8,472,257 | B2 | 6/2013 | Dong et al. |
| 2005/0122779 | A1 | 6/2005 | Fasoli et al. |
| 2007/0263439 | A1 | 11/2007 | Cornwell et al. |
| 2008/0288814 | A1 | 11/2008 | Kitahara |
| 2008/0294949 | A1 | 11/2008 | Sugahara |
| 2009/0010036 | A1* | 1/2009 | Kato et al. ............... 365/51 |
| 2009/0168533 | A1 | 7/2009 | Park et al. |
| 2009/0204824 | A1 | 8/2009 | Lin et al. |
| 2009/0268524 | A1 | 10/2009 | Maejima |
| 2009/0323942 | A1 | 12/2009 | Sharon et al. |
| 2010/0070682 | A1 | 3/2010 | Wan et al. |
| 2010/0322000 | A1 | 12/2010 | Shim et al. |
| 2011/0032759 | A1 | 2/2011 | Kim et al. |
| 2011/0038203 | A1 | 2/2011 | Camp et al. |
| 2011/0119431 | A1 | 5/2011 | Chowdhury |
| 2011/0161784 | A1 | 6/2011 | Selinger et al. |
| 2012/0051137 | A1 | 3/2012 | Hung et al. |
| 2012/0166708 | A1 | 6/2012 | Chung et al. |
| 2012/0166714 | A1 | 6/2012 | Mun et al. |
| 2012/0239861 | A1 | 9/2012 | Lee et al. |
| 2012/0272017 | A1 | 10/2012 | Lee et al. |
| 2012/0284589 | A1 | 11/2012 | Kim et al. |
| 2012/0297111 | A1 | 11/2012 | Hsu et al. |
| 2013/0107628 | A1 | 5/2013 | Dong et al. |
| 2013/0201760 | A1 | 8/2013 | Dong et al. |

FOREIGN PATENT DOCUMENTS

| | | |
|---|---|---|
| WO | WO 2011019600 | 2/2011 |
| WO | WO 2011019602 | 2/2011 |
| WO | WO 2012023102 | 2/2012 |

OTHER PUBLICATIONS

U.S. Appl. No. 13/801,741 entitled "Weighted Read Scrub for Non-volatile Memory," filed Mar. 3, 2013, 45 pages.

U.S. Appl. No. 13/791,200 entitled "Optimized Configurable NAND Parameters," filed Mar. 8, 2013, 37 pages.

U.S. Appl. No. 13/940,504 entitled Efficient Smart Verify Method for Programming 3D Non-Volatile Memory, filed Jun. 12, 2013, 49 pages.

U.S. Appl. No. 14/025,160 entitled "Vread Bias Allocation on Word Lines for Read Disturb Reduction in 3D Non-Volatile Memory," filed Sep. 12, 2013, 54 pages.

U.S. Appl. No. 61/731,198, filed Nov. 29, 2012, 32 pages.

U.S. Appl. No. 61/731,215, filed Nov. 29, 2012, 42 pages.

U.S. Appl. No. 14/064,823, filed Oct. 28, 2013, 48 pages.

U.S. Appl. No. 14/064,887, filed Oct. 28, 2013, 42 pages.

U.S. Appl. No. 13/908,905, filed Jun. 13, 2013, 48 pages.

* cited by examiner

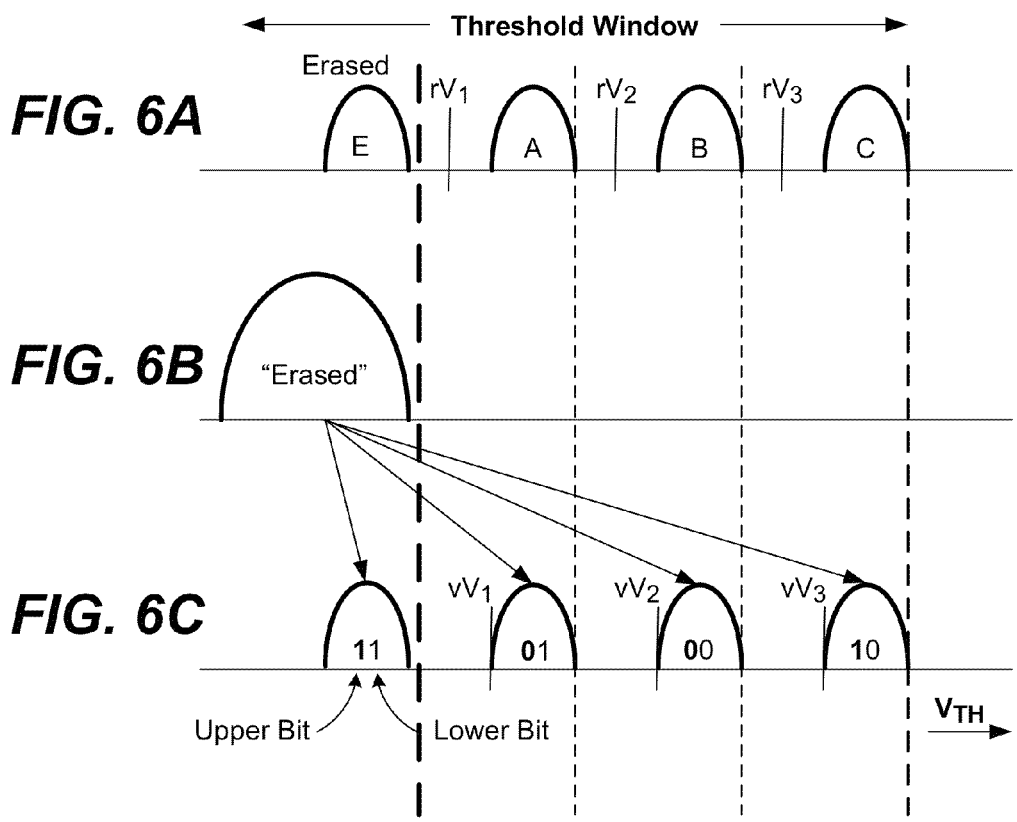
Programming into four states represented by a 2-bit code

BLOCK STRUCTURE PROFILING IN THREE DIMENSIONAL MEMORY

CROSS-RELATED APPLICATION

This application is a continuation of U.S. application Ser. No. 14/064,823 filed Oct. 28, 2013, which application is incorporated herein in its entirety by this reference.

BACKGROUND

This application relates to the operation of re-programmable nonvolatile three dimensional memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In some 3-D memory arrays, characteristics of a memory cell may depend on the diameter of a memory hole where it intersects the memory cell. Memory holes may be non-uniform along their length, and different memory holes may have different profiles. Memory hole diameter may be calculated from characteristics that are observed during programming. Knowing a memory hole profile of a block allows suitable operating parameters to be selected for operating the block. Memory hole profile of a plane may be used to select operating parameters for the plane. Memory hole profile of a die may be used to select operating parameters for the die. Smaller memory holes result in earlier failure. Hot counts may be adjusted according to memory hole size so that blocks that are expected to fail earlier because of small memory holes are more lightly used than blocks with larger memory holes.

An example of a method of characterizing a three-dimensional NAND memory die includes: selecting a plurality of sample blocks from the three-dimensional NAND memory array; writing sample data to a plurality of sample word lines of a plurality of physical levels of the sample blocks to obtain characterization information for the sample word lines; and calculating a physical dimension of memory cells at each of the plurality of levels from the characterization information.

The sample data may consist of a predetermined test pattern for efficiently obtaining the characterization information. The test pattern may assign first logic states to memory cells on a drain side of a NAND string and assign second logic states that are the inverse of the corresponding first logic states to corresponding memory cells on the source side of the NAND string. The physical dimension may be a diameter of a vertical memory hole that extends through memory cells in each of the plurality of levels. The physical dimension may be a thickness of a layer formed in a memory hole that extends through memory cells in each of the plurality of levels. The three-dimensional NAND memory die may include a plurality of planes, and selecting the plurality of sample blocks may include selecting at least one sample block from each of the plurality of planes. The plurality of sample word lines of the plurality of physical levels may include at least one word line from each level in the three-dimensional NAND memory die. The plurality of sample word lines may include all word lines of a sample block. The method may include recording the physical dimension in the three-dimensional NAND memory die. Operating parameters may be selected for memory cells at each of the plurality of levels based on the calculated physical dimension of memory cells at each of the plurality of levels. The operating parameters may include programming voltage and/or programming time used during a write operation. The selected operating parameters may be recorded for each of the plurality of levels. Parameter updating schemes may be selected for the selected operating parameters based on the calculated physical dimension of the memory cells at each of the plurality of levels. A first parameter updating scheme may update parameters associated with small memory hole diameter at a first rate and a second parameter updating scheme may update parameters associated with large memory hole diameter at a second rate that is different to the first rate. The first parameter updating scheme may update a wear level indicator associated with small memory hole diameter at the first rate and the second parameter updating scheme may update a wear level indicator associated with large memory hole diameter at a second rate that is slower than the first rate.

An example of a method of characterizing a three-dimensional NAND memory die includes: selecting a plurality of sample blocks from the three-dimensional NAND memory array; writing sample data to a plurality of sample word lines in a sample block, each physical level in a sample block containing at least one of the plurality of sample word lines, to obtain characterization information for the sample word lines; and calculating a memory hole diameter at each physical level in the sample block from the characterization information.

The write characterization information may include loop count information for programming the sample word lines. The write characterization information may include information obtained from verification when programming the sample word lines. The write characterization information may include maximum programming voltage information for programming the sample word lines. A wear rate may be calculated for each level from the calculated memory hole diameter for the level. A wear rate for a particular level may indicate the rate at which memory cells of the level approach a wear-out condition with increasing numbers of write-erase cycles.

An example of a three-dimensional NAND memory includes: an array of memory cells arranged in a plurality of levels; a plurality of memory hole structures extending vertically through the plurality of levels to connect memory cells of the plurality of levels in NAND strings; a write circuit configured to write sample data to sample word lines at different levels of the plurality of levels; and a characterization circuit configured to receive information regarding the writing of sample data to sample word lines from the write circuit, the characterization circuit determining one or more physical dimensions of a memory hole structure at the different levels from the information.

Read circuits may be configured to read the sample data from the sample word lines at different levels of the plurality of levels and to send information regarding the reading of sample data to the characterization circuit. The information regarding the reading of sample data may be used to determine the one or more physical dimensions. The one or more physical dimensions may include an outer dimension of the memory hole structure established by an inner dimension of a memory hole in which the memory hole structure is formed. The information regarding the writing of sample data to sample word lines may include at least one of: loop count information, verification information, and maximum programming voltage information for each of the sample word lines.

An example of a method of operating a three-dimensional NAND memory die includes: testing memory cells at a plurality of levels in the three-dimensional NAND memory array to obtain characterization information for each of the plurality of levels; calculating a physical dimension of memory cells at each of the plurality of levels from the characterization information; calculating at least one initial value of an operating parameter for each of the plurality of levels, the initial value of the operating parameter for a level calculated from the physical dimension calculated for the level; and calculating a rate of change of the operating parameter for each of the plurality of levels, the rate of change of the operating parameter for a level calculated from the physical dimension calculated for the level.

The physical dimension may be a diameter of a memory hole that extends through memory cells. A higher rate of change of the operating parameter may be calculated for smaller memory hole diameter and a lower rate of change of the operating parameter is calculated for larger memory hole diameter. After a period of use, testing of the memory cells may be repeated at the plurality of levels in the three-dimensional NAND memory array to obtain post-use characterization information. The post-use characterization information may be compared with the characterization information and recalculating the physical dimension of memory cells at each of the plurality of levels from the post-use characterization information if a difference between the post use characterization information and the characterization information exceeds a threshold amount. An aggregated memory hole diameter may be calculated for a block and a wear rate may be calculated for the block from the aggregated memory hole diameter. An effective age for the block may be calculated from the number of write-erase cycles experienced by the block and the wear rate calculated for the block.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

DETAILED DESCRIPTION

Memory System

Figure 1:
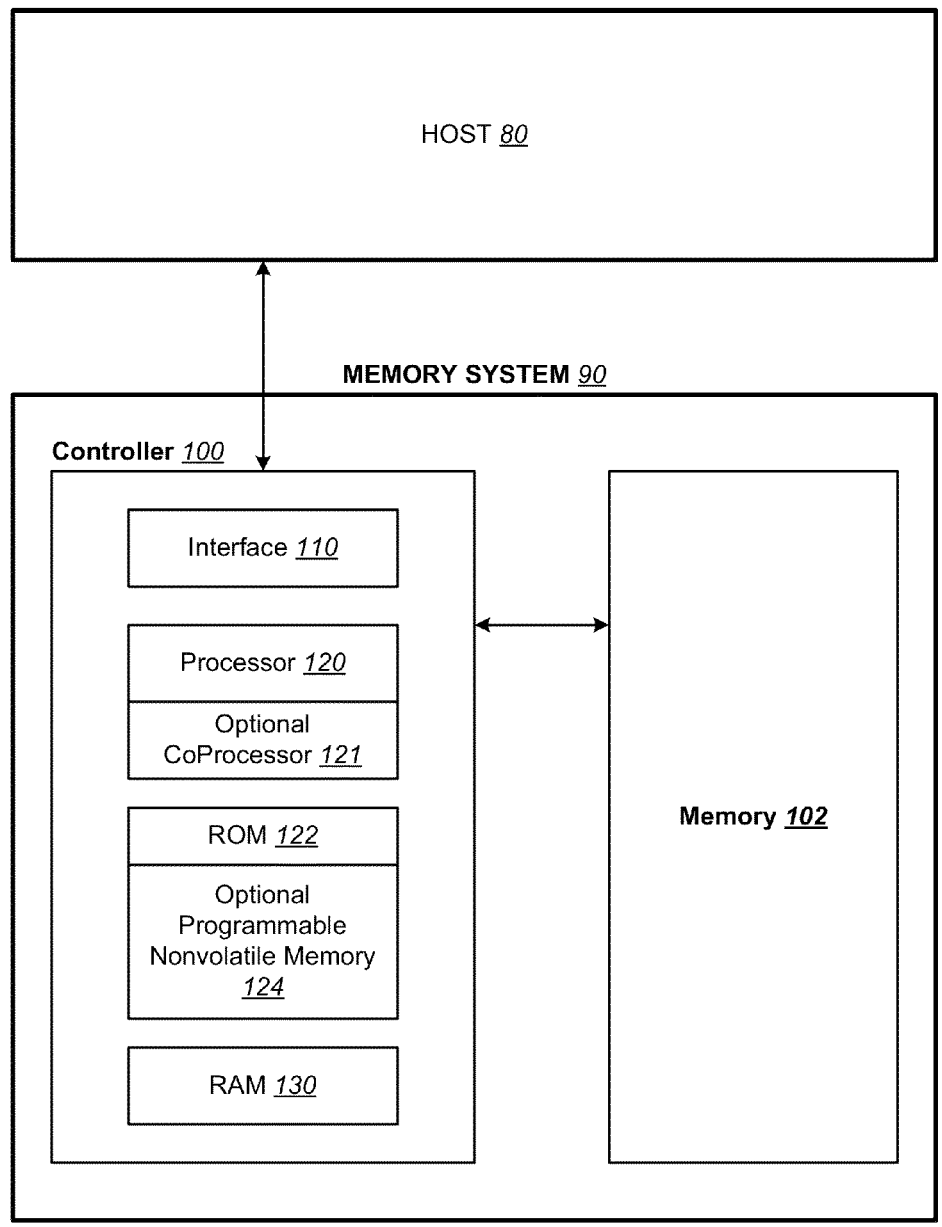
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
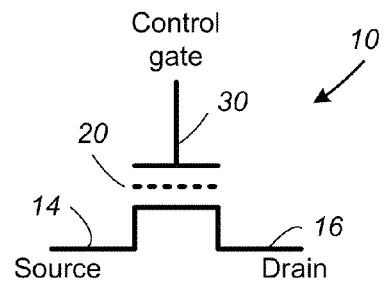
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
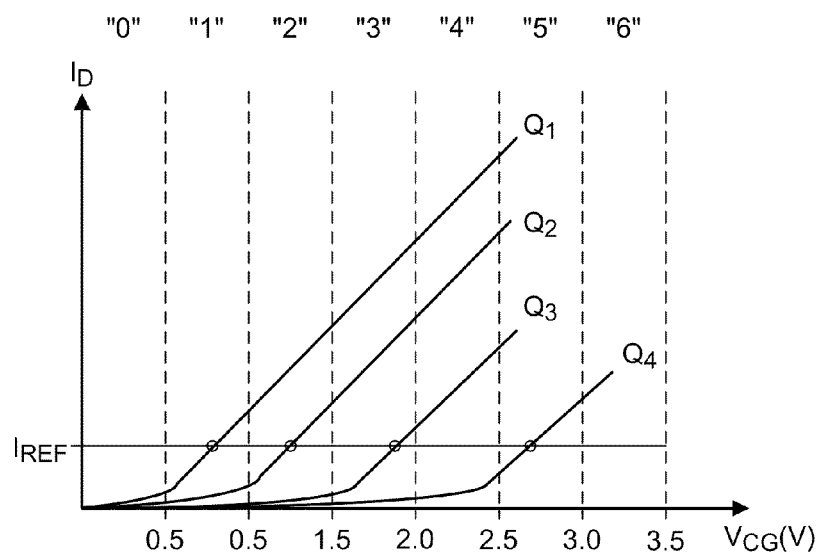
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
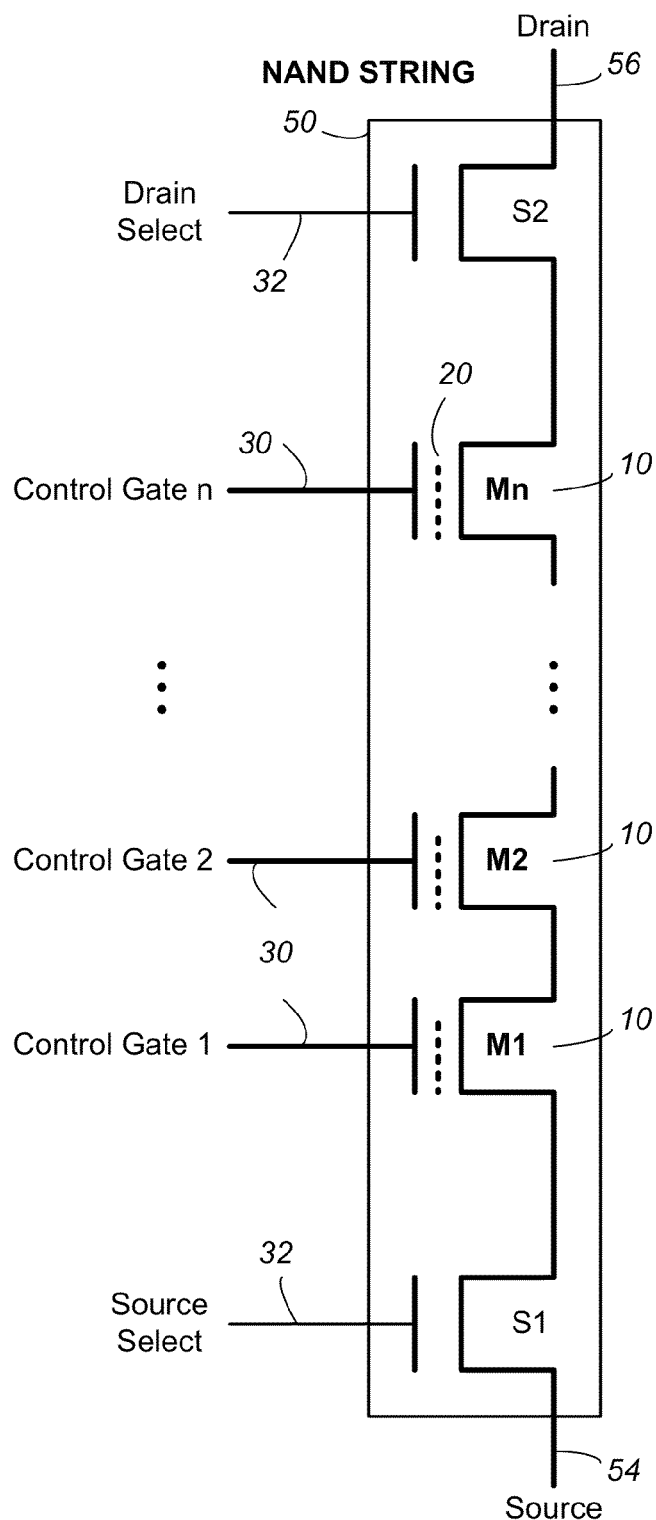
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
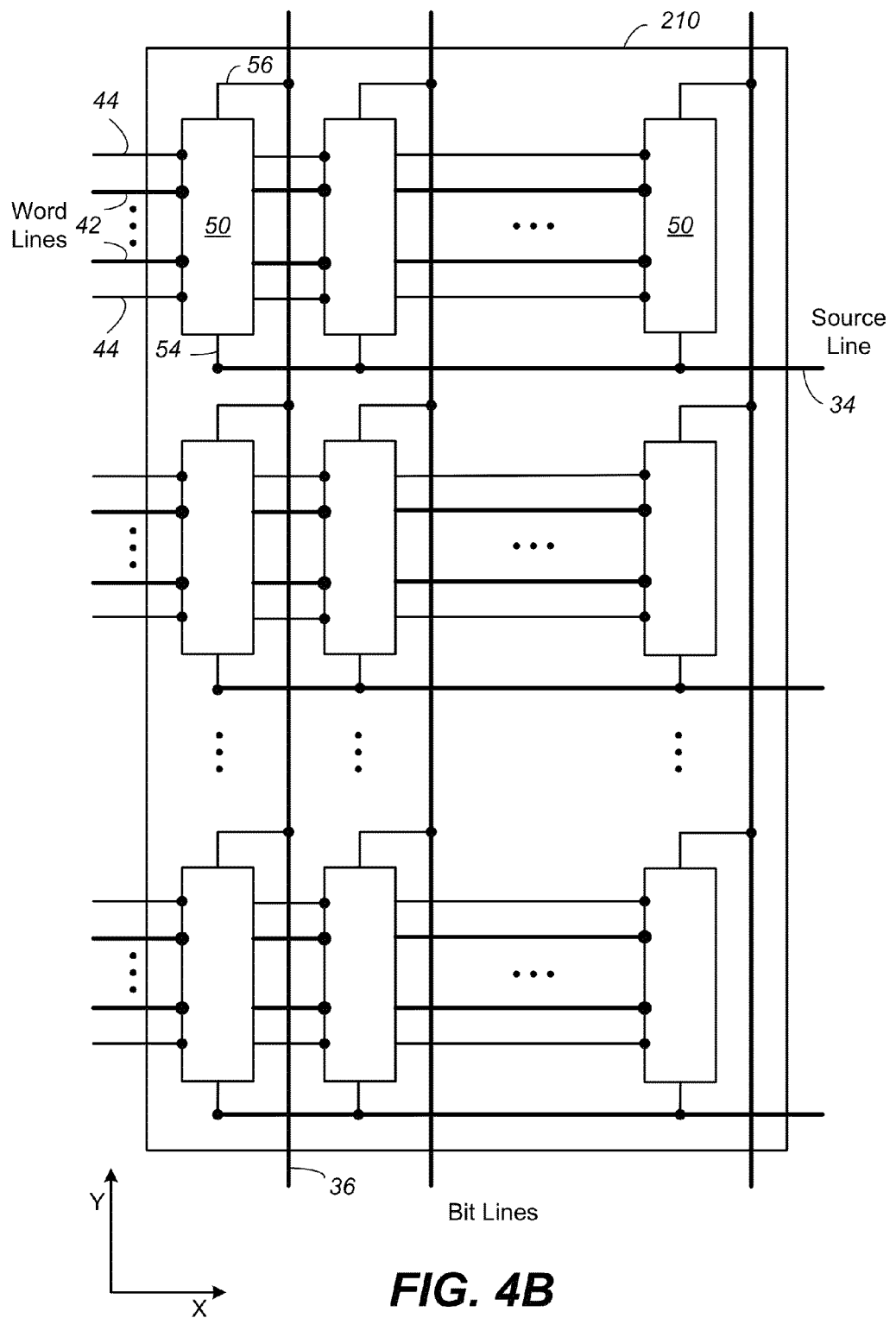
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
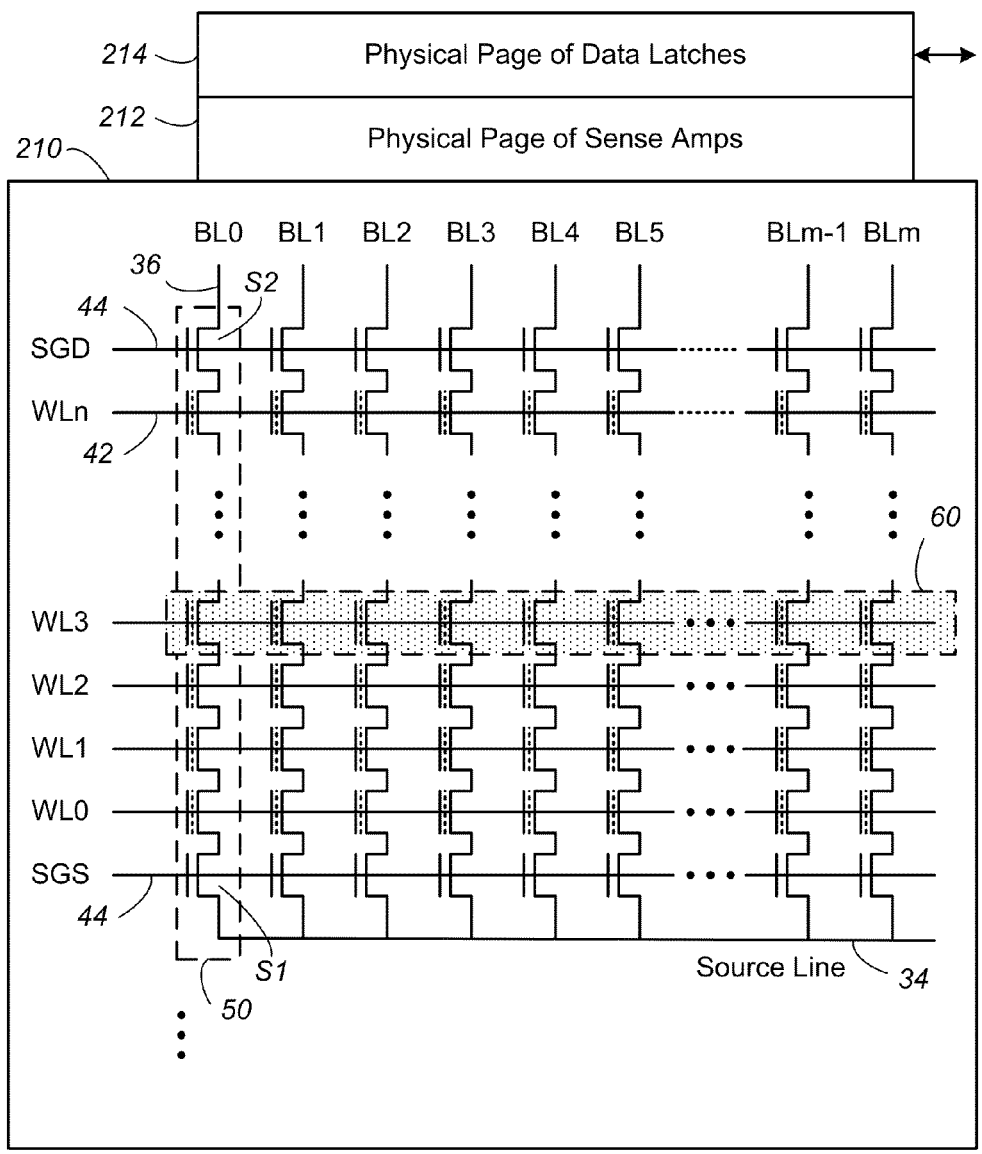
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

all-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
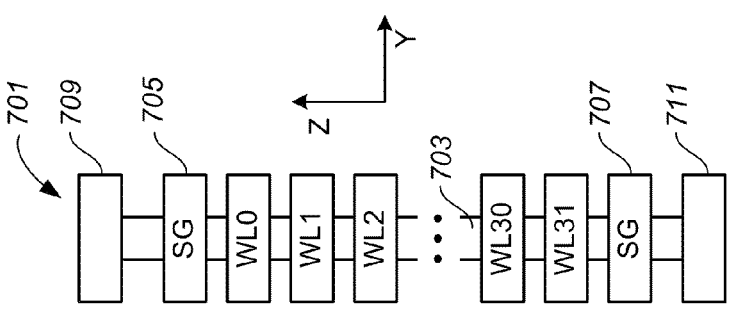
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
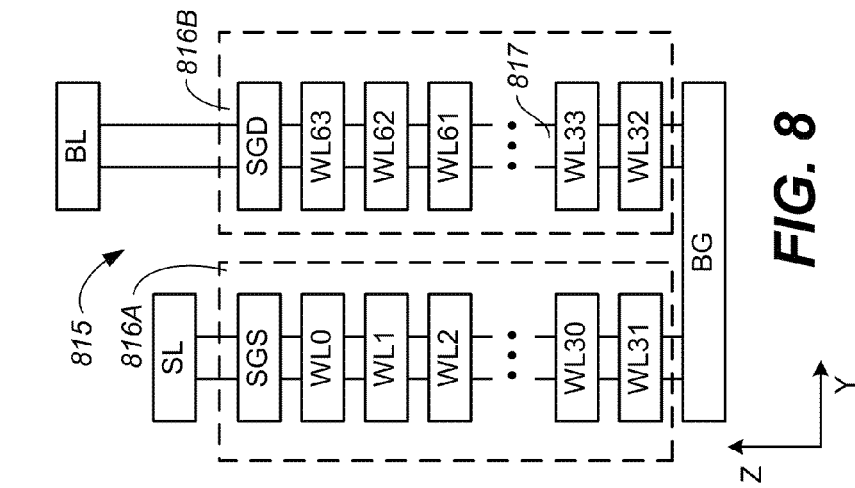
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
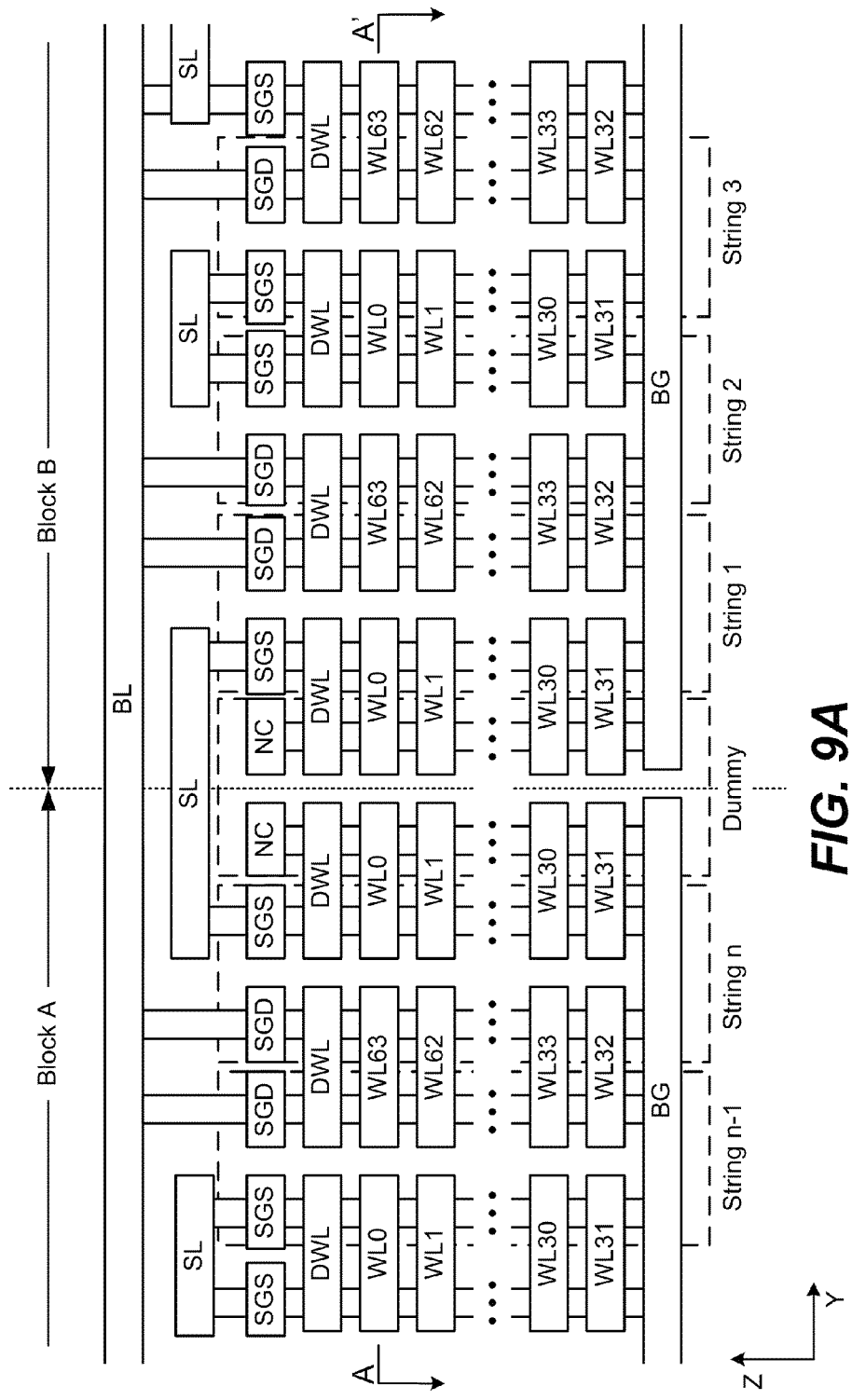
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates. The structure of back gates is further explained below.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 9B:
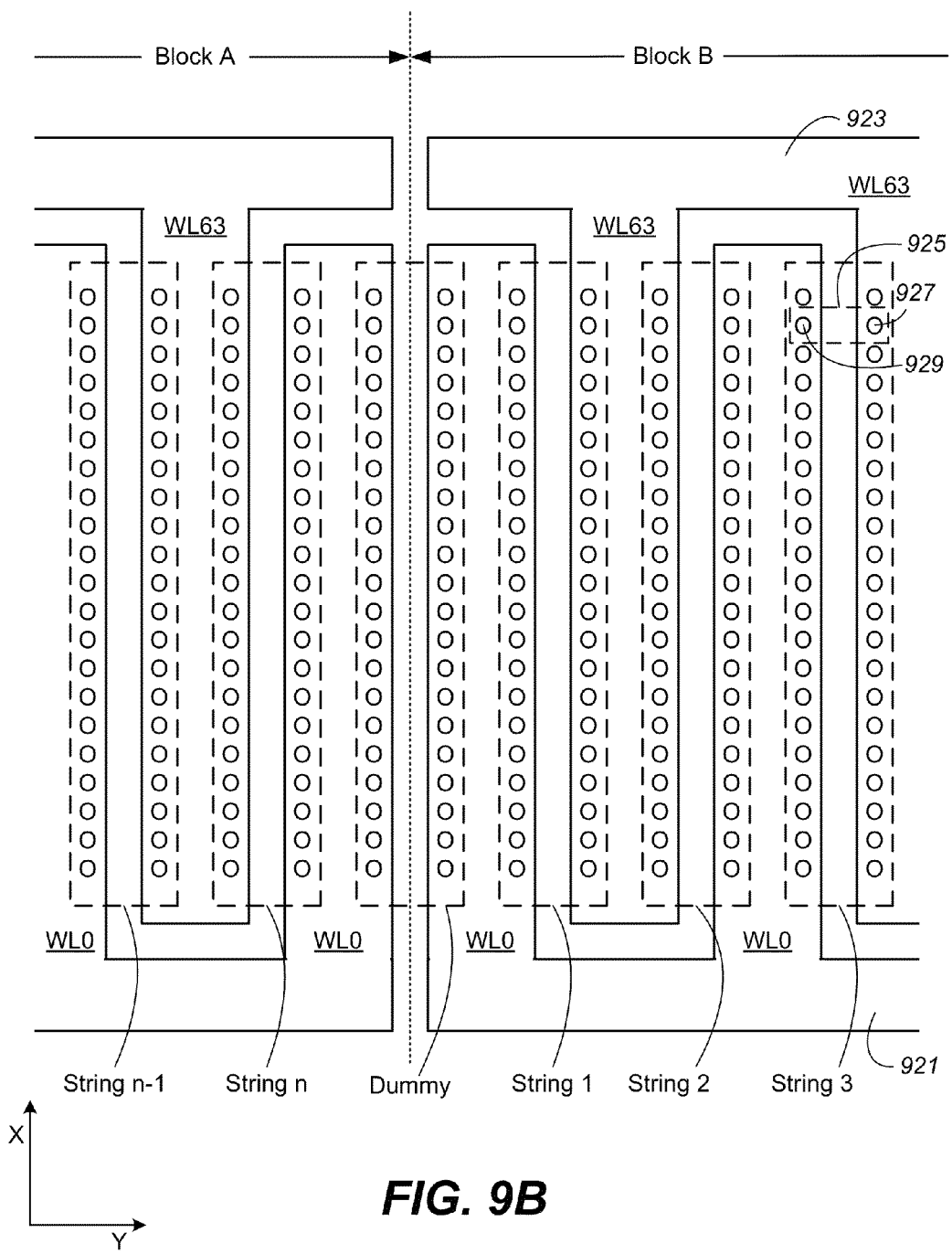
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921, Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL63 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the x-direction). For example, one such set is made up of all strings indicated by "String 3" in Block B, including string 925.

Figures 10A, 10B:
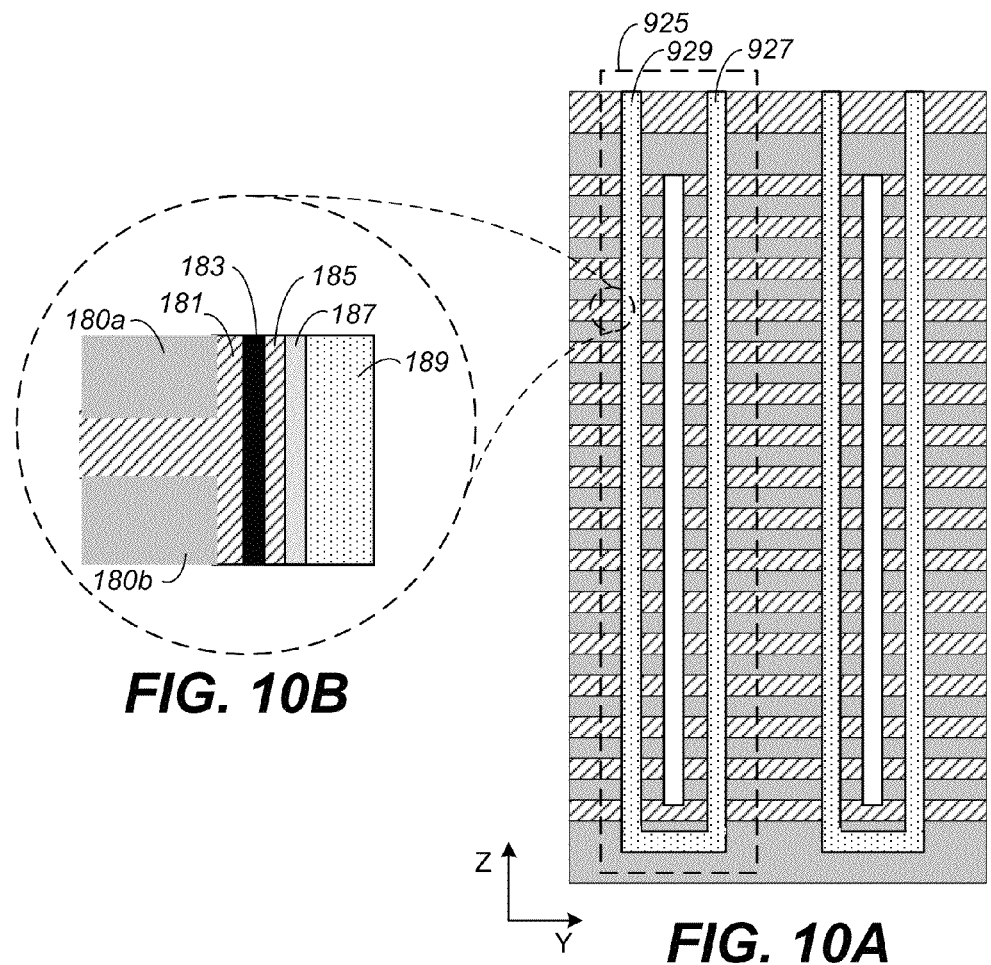
FIGS. 10A-10B shows examples of structures of NAND strings.

FIG. 10A shows a cross section along a y-z plane that intersects memory holes 927, and 929 of NAND string 925 so that the structures formed within memory holes (memory hole structures) may be clearly seen. FIG. 10A shows that memory holes 927 and 929 are connected together at the bottom so that the two wings may be electrically connected in series.

FIG. 10B shows the structure of a stack of layers in the memory hole 929 where memory cells are formed (the memory hole structure). It can be seen that a blocking dielectric "Block" 181 is deposited on the walls of the memory hole to provide electrical isolation from word lines 180a, 180b. A Charge Trapping Layer (CTL) 183 is deposited on the blocking dielectric 181. The CTL layer 183 forms charge storage elements where the CTL is in close proximity to polysilicon word lines 180a, 180b. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

Figure 11:
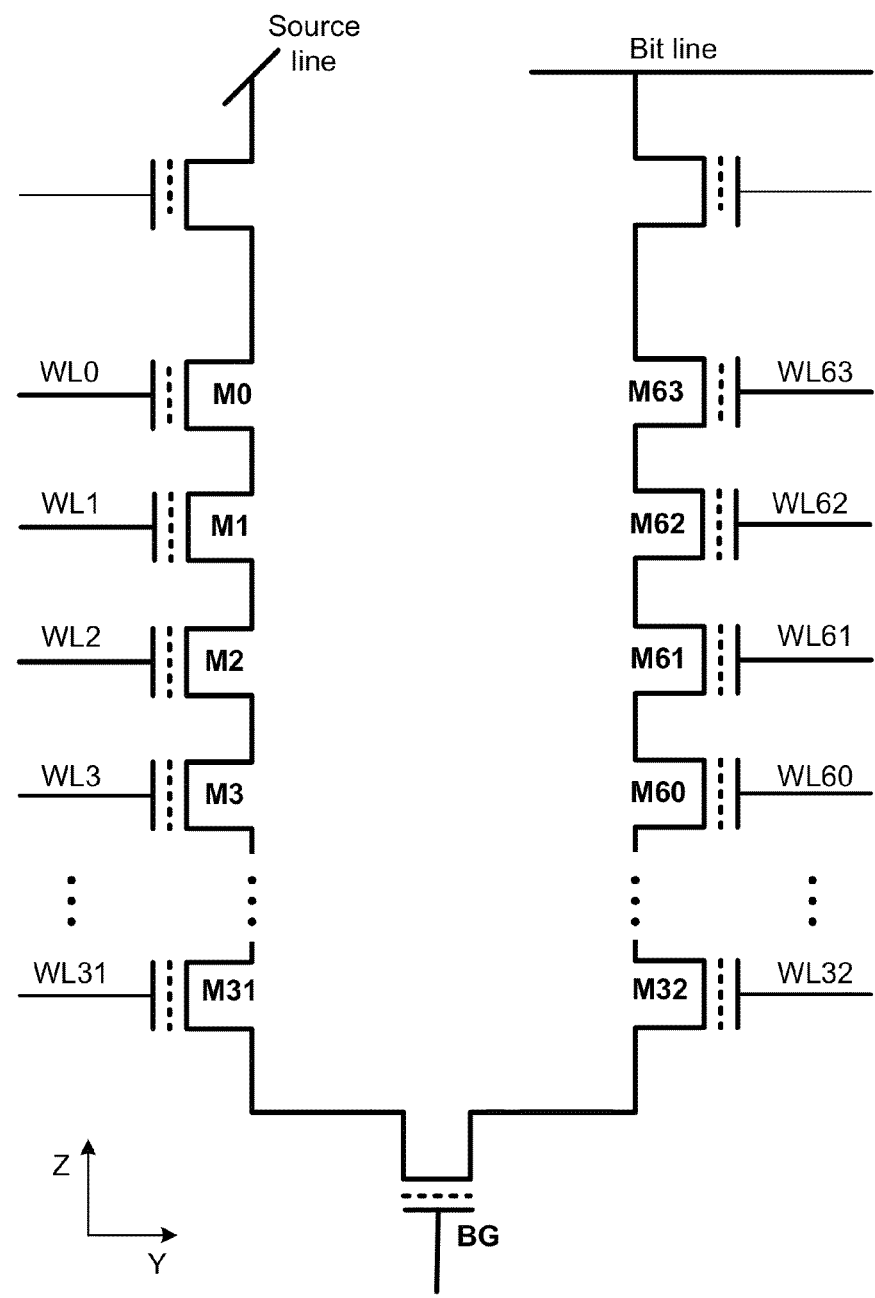
FIG. 11 is a schematic of a NAND string with two wings connected by a back gate.

FIG. 11 shows a schematic of a U-shaped NAND string, similar to the U-shaped NAND strings of FIG. 10A, including memory cells M0-M63. In order to access the cells of the NAND string, appropriate voltages are applied to various lines associated with the NAND string, including the source select line, drain select line, source line, and bit line. Programming, reading, and erasing of memory cells may be performed by applying appropriate voltages using driver circuits in a peripheral area of a memory chip.

One difference between a three dimensional memory array and a two dimensional memory array is that certain physical dimensions of memory cells may vary with the location of the memory cells in the vertical direction. While memory cells in a planar array may be made by process steps that generally have uniform effect across the plane of the substrate, some steps in formation of three dimensional memory arrays are not uniform from layer to layer and may also have significant non-uniformity laterally across a substrate. For example, memory holes may be formed by etching down through multiple layers using an appropriate anisotropic etch. However, such holes may not be perfectly uniform from top to bottom because of the high aspect ratio that is typical of such memory holes. In general, such memory holes are wider towards the top than the bottom. Or, they may be widest somewhere near the top with some narrowing towards the top.

Figure 12A:
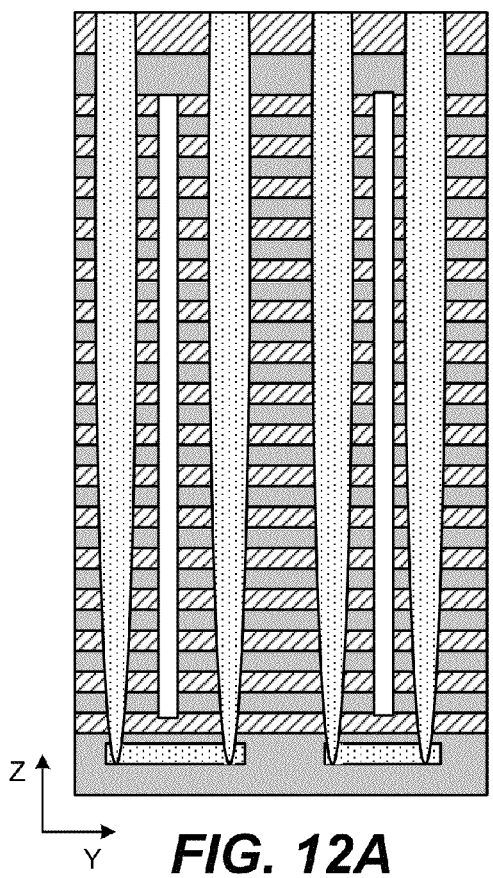
FIG. 12A shows variation in memory hole diameter.
Figure 12B:
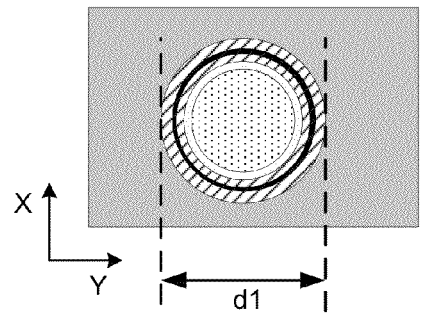
FIG. 12B shows a cross section of a memory hole in an upper level.
Figure 12C:
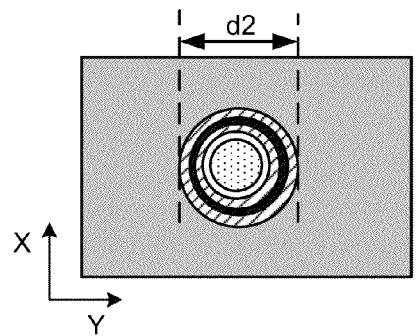
FIG. 12C shows a cross section of a memory hole in a lower level.

FIG. 12A shows an example of how memory hole diameter may vary with vertical distance from the substrate. Memory holes are narrower towards the bottom of the memory hole compared with the top of the memory hole. FIG. 12B shows a cross section of a memory hole having a relatively large diameter, d1, for example near the top of a memory hole (relatively far from the substrate). FIG. 12C shows a cross section of a memory hole having a relatively small diameter, d2, for example near the bottom of a memory hole (relatively near the substrate). Diameter d2 is significantly less than diameter d1 which leads to a significantly stronger electric field within the memory hole of FIG. 12C compared with FIG. 12B under the same conditions (e.g. when the same voltage applied to the word line). A higher electric field affects the characteristics of memory cells. For example, programming and erase may be faster for a smaller diameter memory hole under the same conditions. Higher electric field strength may also cause increased wear and earlier failure of memory cells with small memory hole diameters.

Knowledge of memory hole diameters at different locations may allow memory operation at those locations to be adapted according to the expected characteristics. U.S. patent application Ser. No. 13/791,200, filed on Mar. 8, 2013, entitled, "Optimized configurable NAND parameters," and corresponding U.S. Provisional Application No. 61/731,198, filed on Nov. 29, 2012, which are hereby incorporated by reference in their entirety, describe predicted memory hole variation and how it may be used to select appropriate parameters for different levels. U.S. patent application Ser. No. 13/801,741, filed on Mar. 13, 2013, entitled, "Weighted read scrub for nonvolatile memory," and corresponding Provisional Application No. 61/731,215, filed on Nov. 29, 2012, which are hereby incorporated by reference in their entirety, describe prioritizing scrubbing of data according to predicted memory hole size.

Memory hole diameter as a function of location is somewhat predictable because etch chemistry tends to produce larger diameters near the top of an etched memory hole than near the bottom. However, this predictability is limited and there may be significant variation from one memory hole to another. Different dies formed in the same wafer may have memory holes with different profiles. For example, dies near the edge of a wafer may have different memory hole profiles than dies near the center of a wafer. Even within a single die, there may be significant variation from block to block.

According to an aspect of the present invention, memory hole diameters at different locations are determined by performing certain characterization operations from which the diameters of memory holes are calculated. Thus, memory hole diameters are found by direct testing rather than being assumed from some model, or from some testing on a sample chip. This allows a memory hole profile to be calculated from characterization information for an individual block, plane, die, or other unit. Such specific knowledge of memory hole profiles may allow more accurate use of techniques based on memory hole profiles such as optimizing parameters, weighted scrub, or other techniques. For example, a wear leveling scheme may be configured to ensure that memory cells with smaller memory holes that tend to wear faster receive fewer write/erase cycles than memory holes with larger memory holes that tend to wear more slowly.

In an example, memory hole profiles of a memory die are obtained by performing characterization operations on sample blocks in the die. This characterization may be performed as part of a testing operation at a factory (e.g. combined with looking for bad blocks, bad word lines, physical defects, etc.). Alternatively, memory hole characterization may be performed after a memory die has left the factory, after it is incorporated into a memory system. A memory controller that is connected to the memory die may perform the characterization operation. Such a controller may be configured by firmware to carry out the characterization operation and to use the characterization information obtained to operate the memory die in an efficient manner.

Characterization operations to determine memory hole diameter may include a number of different steps. Program, data retention, read, and erase characteristics may vary according to memory hole diameter so that program, retention, read, and/or erase steps may be used to obtain characterization information. A combination of such steps may provide more accurate information.

While memory hole diameter is one physical dimension that may be obtained, aspects of the present invention may be used to obtain other physical dimensions of memory cells also. For example, thicknesses of different layers in a memory hole structure may vary with location (layers may be thinner near the bottom of a memory hole compared with near the top). For example, tunnel dielectric layer thickness may vary and may affect memory cell characteristics. Program, read, and erase operations may be affected by such dimensions. Characterization information may be used to calculate such thicknesses. For example, tunnel dielectric thickness, blocking dielectric thickness, or other layer thicknesses, may be obtained from characterization information.

According to an example, characterization information may be obtained from programming test data to memory cells and observing the time and/or voltages needed to bring memory cells along a word line to their programmed states. Programming of flash memory cells along a word line generally includes applying a series of programming pulses to the word line, with appropriate voltages on channels to promote or inhibit charge flow to charge storage elements. In some systems, the number of programming pulses needed to program a word line and/or other programming parameters may be recorded and used as characterization information. U.S. patent application Ser. No. 13/940,504, filed on Jun. 12, 2013, entitled, "Efficient smart verify method for programming 3D non-volatile memory," and corresponding U.S. Provisional Application No. 61/763,085, filed on Feb. 11, 2013, which are hereby incorporated by reference in their entirety, describe using the number of programming pulses (loop count) for an initial set of memory cells to determine an appropriate programming voltages for subsequent memory cells. U.S. patent application Ser. No. 14/025,160, filed on Sep. 12, 2013, entitled, "Vread bias allocation on word lines for read disturb reduction in 3D non-volatile memory," which is hereby incorporated by reference in its entirety, describes calculating read pass voltages based on program voltage trim values.

Figure 13:
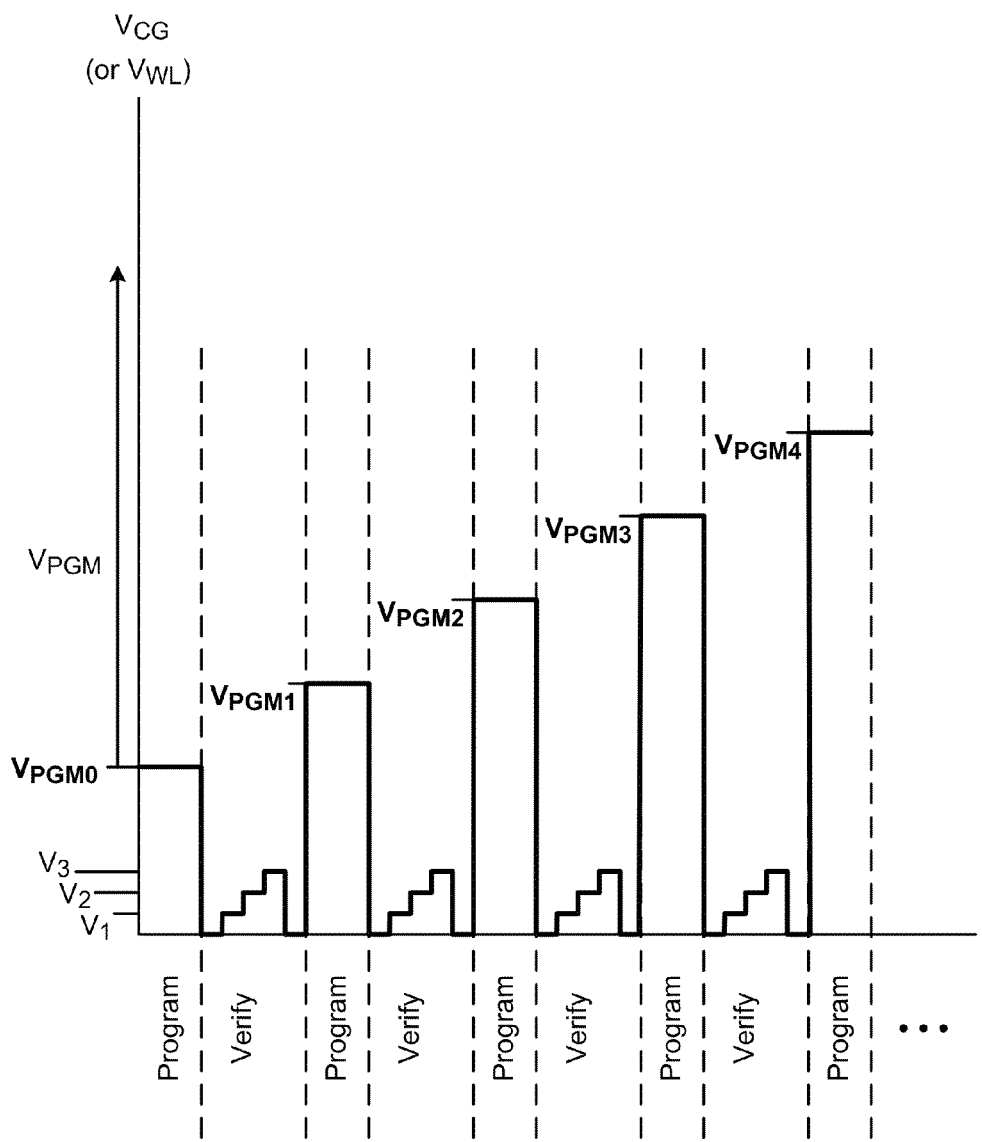
FIG. 13 illustrates a series of program pulses with verify steps.

FIG. 13 illustrates a technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$, then $V_{PGM1}$, then $V_{PGM2}$, and so on. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified. One method of program-inhibiting a memory cell is to raise its bit line voltage from 0V to VCC during programming. In this way, even when the cell's control gate has a programming voltage on it, the effective programming voltage on the floating gate is reduced by VCC, thereby inhibiting further programming of the cell.

During programming, characterization information may be recorded for later use. For example, when programming along a particular word line, the number of programming pulses needed to complete programming (loop count) may be recorded for the word line. Loop count may vary from word line to word line. In particular, loop count is generally smaller for memory cells with small memory holes and larger for memory cells with large memory holes because of the stronger electric field created in a smaller memory hole under the same applied voltages.

In some cases the highest program voltage used may be recorded as characterization information. For example, if programming of a word line ends after a pulse of VPGM3 is applied then VPGM3 may be recorded as the highest programming voltage used. In general, higher voltage pulses are needed for larger memory holes. After data is programmed, the data may be maintained in the memory cells over a period of time to test data retention characteristics of the memory cells. Environmental factors may be controlled during this period to simulate real world conditions or worst case scenarios. For example, temperature may be raised above room temperature, electromagnetic fields may be applied, mechanical vibration or shock may be applied, or other environmental parameters may be controlled in various ways. The memory array may be accessed during data retention testing, for example by writing and erasing other portions of the memory array and by read operations directed to the test pattern or to other data. Data may then be read and additional characterization information may be collected during reading. Characterization information may also be collected from erase operations although such information may be on a block by block basis rather than a word line by word line basis.

Characterization information gathered from one or more test operations may be used to calculate memory hole diameter. In general, characterization information may be correlated to memory hole diameter either using actual memory hole diameters obtained from destructive testing of sample dies, or using modeling. For example, testing may show that memory hole diameter of X nanometers correlates with a loop count=Y. Once such a correlation is obtained from destructive testing of sample dies, it may be used to calculate memory hole diameter in operational dies from non-destructive testing.

While level to level variation in memory hole diameter is somewhat predictable for a given process (i.e. for a given stack of layers to be etched, etch chemistry, nominal memory hole diameter and depth), variation from one memory hole to another across a wafer, or within a die may be less predictable. Knowledge of such variation may allow different dies to be operated using operating parameters that are better suited to their particular physical structures. Even within a die, different planes, or different blocks may have different memory hole profiles that affect performance. Knowledge of such profile variation may allow the memory system to select appropriate operating parameters on a plane by plane or block by block basis.

According to an aspect of the present invention, sample blocks are selected in a memory die for memory hole characterization. It may be desirable to select at least one block from each plane in the memory die. In some cases memory hole characterization is performed on all blocks (i.e. all blocks are sample blocks). A test pattern is programmed to memory cells of the sample blocks and characterization information is collected. The characterization information is then correlated with memory hole diameter and an average memory hole profile, or some aggregated memory hole data, may be generated for each sample block. Operating parameters may be selected based on the aggregated memory hole data. For example, operating parameters for a plane may be selected based on the average memory hole profile obtained for a sample block or blocks in the plane. In some cases, a single average memory hole profile is obtained for an entire die.

A suitable test pattern may be selected to efficiently obtain the desired characterization data. A test pattern may program all word lines of a block, or a subset of all word lines. In some cases, a test pattern may represent a worst case scenario (e.g. with a large number of memory cells programmed to high states). In some cases, a test pattern may be designed to quantify the effect of earlier programmed cells on later programmed cells along NAND strings (sometimes referred to as a "back pattern effect"). In one example, a pattern of data is programmed along U-shaped NAND strings so that the data pattern on the source side is the inverse of the data pattern on the drain side. This ensures that each cell has a different memory state to a corresponding memory cell in the same NAND string that is at the same level.

Block Aging

According to an example, a memory hole profile, and/or other aggregated data, is calculated for each block and is used to determine operating parameters for the block. Knowledge of memory hole profiles allows some block-specific prediction of aging characteristics. Blocks with narrower memory holes may be expected to wear faster. That is, because of the higher electric field in such a block, the block would be expected to wear out after a smaller number of write-erase cycles. Life expectancy of a block increases with memory hole diameter so knowing memory hole diameter allows prediction of life expectancy of the block. An average memory hole diameter for the block may be used for this purpose, or a weighted average, or the smallest memory hole diameter of the block may be used. Some memory systems track the number of write-erase cycles for each block ("hot count") and use these numbers to perform wear leveling so that blocks experience similar usage and so that blocks do not tend to wear out prematurely. These numbers may be adjusted to reflect life expectancy so that usage is more concentrated in blocks with longer life expectancy, and blocks with low life expectancy experience lighter usage.

According to an example, fixed values are added to hot counts of blocks that have narrow memory holes. For example, a block may have its hot count incremented by 100 for every nanometer by which its memory hole diameter is less than a nominal memory hole diameter. Thus, a block with a memory hole diameter that is 3 nm less than the nominal memory hole diameter would have its hot count incremented by 300 and wear leveling would direct new writes to other blocks until hot counts of other blocks reached 300 cycles.

According to another example, individualized multipliers are applied to the actual hot counts of different blocks. Thus, while some blocks may have hot counts incremented by one for each write-erase cycle, other blocks may apply a multiplier X so that their hot count increases by X for each write-erase cycle. The value of X may be a function of the difference between actual memory hole diameter and a nominal memory hole diameter. For example, the multiplier may be the number of nanometers by which a block's memory hole diameter is less than a nominal memory hole diameter. Thus, a block with a memory hole diameter that is 3 nm less than the nominal memory hole diameter would have its hot count increase by three every time it undergoes a write-erase cycle. Wear leveling would ensure that such a block experienced one third as much use as a block having its hot incremented by one per write-erase cycle.

Other schemes for managing block usage according to their block-specific aging characteristics may be implemented and techniques are not limited to applying a fixed offset, or a multiplier to a hot count. Knowledge of block-by-block life expectancy may allow a wide variety of schemes to manage block usage and avoid premature block failures which may lead to premature die failure.

Figure 14:
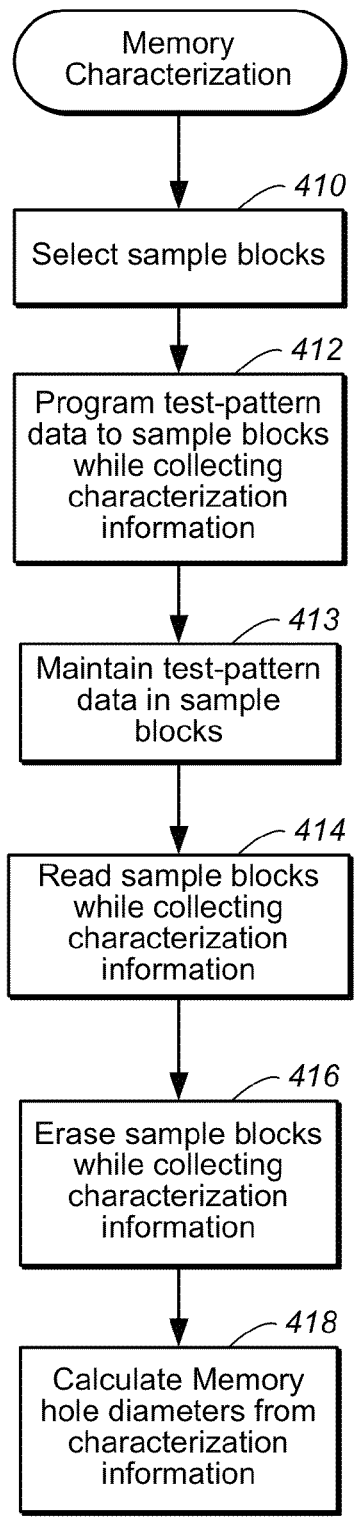
FIG. 14 illustrates a memory characterization operation.

FIG. 14 shows an example of a memory characterization operation. One or more sample blocks are selected 410 and test-pattern data is programmed to the sample blocks while characterization information (such as loop count, programming voltage, etc.) is collected 412. The data is then maintained in the memory cells for a period of time 413 during which environmental parameters such as temperature may be controlled (e.g. high temperature applied). The test-pattern data is then read while collecting additional characterization information 414. In some cases, the reading may be performed periodically to check data retention over an extended period. The sample blocks are then erased while collecting additional characterization information 416 (e.g. erase voltage, or time, or other parameters). Memory hole diameters are then calculated from the combined characterization information 418. This calculation may provide a memory hole profile that is an aggregate for the block, or may calculate a single memory hole diameter that is aggregated over the block (average, weighted average, or some other aggregated value). While programming, data retention, reading, and erasing are all performed in this example, characterization may be based on just one or two such operations (e.g. program and erase, without read) in some cases. Calculated memory hole diameters may then be used for a variety of purposes.

Memory characterization may be performed prior to use (at the factory or during initialization). Memory characterization may also be performed after some significant use. While the physical dimensions of a memory hole, or memory hole structure, may remain the same, some characterization information may change and may provide insight into how memory cells change with use. Such information may allow readjustment of operating parameters from their initial settings. Portions of the memory array that are wearing out faster may also be identified in this way and corrective action may be taken (e.g. hot counts may be adjusted to reflect any areas that appear to be in danger of wearing out prematurely).

Figure 15:
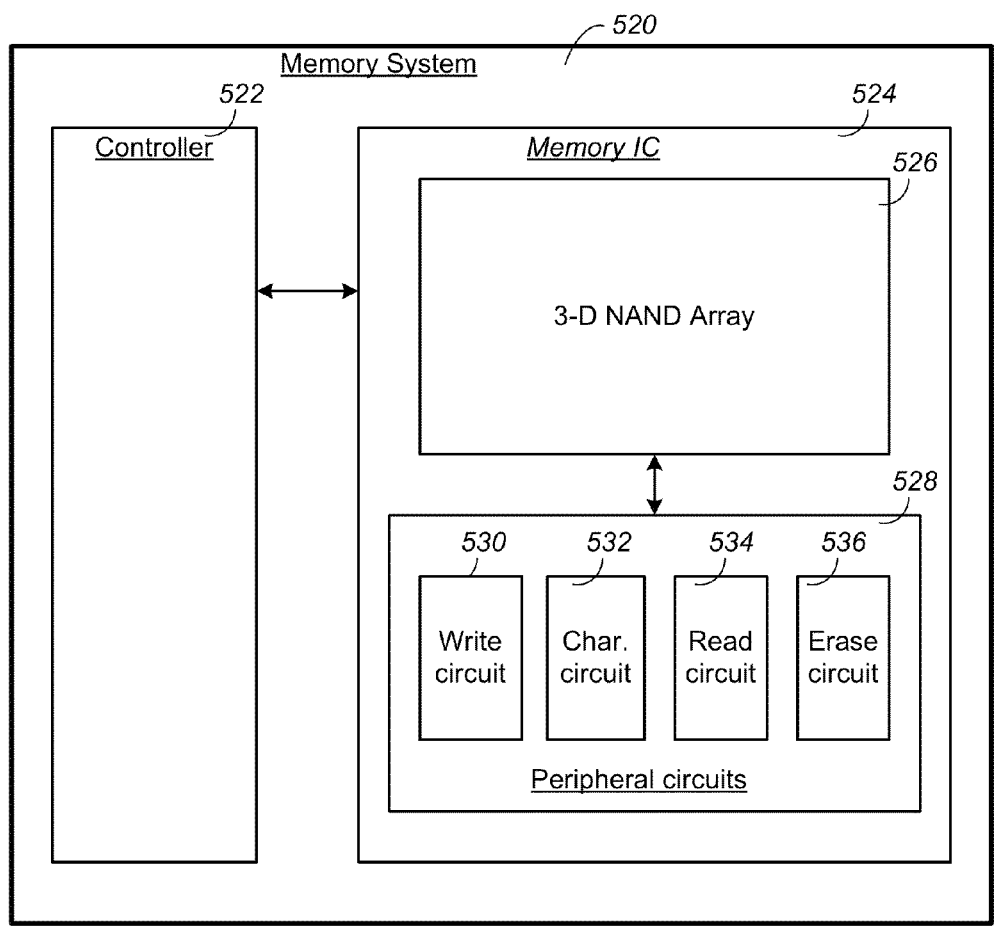
FIG. 15 shows an example of a memory system with adaptive erase.

FIG. 15 shows an example of hardware that may be used to implement aspects of the present invention. A memory system 520, which may be implemented in a memory card, USB drive, Solid State Drive (SSD) or other unit, contains a memory controller 522 and a memory Integrated Circuit (IC) 524. The memory IC includes a three dimensional NAND array 526 in which memory hole structures extend vertically to connect memory cells at different levels along NAND strings. The memory IC 524 also includes peripheral circuits 528 including a write circuit 530. The write circuit 530 may be configured to write sample data to sample word lines at different levels of 3-D NAND array 526. A characterization circuit 532 is also provided to receive characterization information and to determine one or more physical dimensions of memory hole structures at different levels (e.g. memory hole diameter at different levels). A read circuit 534 is provided to read sample data and send information regarding the reading to the characterization circuit. An erase circuit 536 is provided to erase blocks and send information regarding the erase to the characterization circuit.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A three-dimensional nonvolatile NAND memory comprising:
    a three-dimensional array of nonvolatile memory cells formed in a plurality of physical levels disposed above a substrate;
    a plurality of memory hole structures extending vertically through the plurality of physical levels to connect memory cells of the plurality of physical levels in NAND strings;
    a write circuit configured to write sample data to sample word lines at different physical levels of the plurality of physical levels;
    a characterization circuit configured to receive information regarding the writing of sample data to sample word lines from the write circuit, the characterization circuit determining one or more physical dimensions of a memory hole structure at the different physical levels from the information; and a parameter selecting circuit that selects operating parameters for memory cells of different physical levels of the plurality of physical levels based on the one or more physical dimensions of the memory hole structure at the different physical levels.

2. The three-dimensional nonvolatile NAND memory of claim 1 further comprising read circuits on the substrate configured to read the sample data from the sample word lines at different physical levels of the plurality of physical levels and to send information regarding the reading of sample data to the characterization circuit.

3. The three-dimensional nonvolatile NAND memory of claim 2 wherein the information regarding the reading of sample data is used to determine the one or more physical dimensions.

4. The three-dimensional nonvolatile NAND memory of claim 1 wherein the one or more physical dimensions includes an outer dimension of the memory hole structure established by an inner dimension of a memory hole in which the memory hole structure is formed.

5. The three-dimensional nonvolatile NAND memory of claim 1 wherein the information regarding the writing of the sample data to the sample word lines includes at least one of: loop count information, verification information, and maximum programming voltage information for each of the sample word lines.

6. The three-dimensional nonvolatile NAND memory of claim 1 wherein the write circuit and the characterization circuit are located on the substrate.

7. The three-dimensional nonvolatile NAND memory of claim 1 wherein the one or more physical dimensions includes memory hole diameter, first operating parameters being selected for memory cells of a first physical level in which memory hole diameters are large and second operating parameters being selected for memory cells of a second physical level in which memory hole diameters are small.

8. The three-dimensional nonvolatile NAND memory of claim 7 wherein the operating parameters include programming voltage and/or programming time used during a write operation.

9. The three-dimensional nonvolatile NAND memory of claim 7 wherein parameter updating schemes for the operating parameters are selected based on the one or more physical dimensions including memory hole diameter.

10. The three-dimensional nonvolatile NAND memory of claim 9 wherein a first parameter updating scheme updates the first operating parameters for the memory cells of the first physical level at a first rate and a second parameter updating scheme updates the second operating parameters for the memory cells of the second physical level at a second rate that is different to the first rate.

11. A method of operating a three-dimensional nonvolatile NAND memory formed in two or more physical levels of memory cells disposed above a substrate comprising:

testing memory cells at a plurality of the physical levels in the three-dimensional NAND memory to obtain characterization information for each of the plurality of physical levels;

calculating one or more physical dimensions of memory cells at each of the plurality of physical levels from the characterization information; and calculating at least one initial value of an operating parameter for each of the plurality of levels, the initial value of the operating parameter for a physical level calculated from the one or more physical dimensions calculated for the physical level.

12. The method of claim 11 wherein the one or more physical dimensions include a diameter of a memory hole that extends through memory cells.

13. The method of claim 12 further comprising calculating an aggregated memory hole diameter for a block and calculating a wear rate for the block from the aggregated memory hole diameter.

14. The method of claim 11 wherein the operating parameters include programming voltage and/or programming time used during a write operation.

15. The method of claim 11 wherein the one or more physical dimensions includes memory hole diameter, and further comprising calculating first initial operating parameters for memory cells of a first physical level in which memory hole diameters are large and calculating second initial operating parameters for memory cells of a second physical level in which memory hole diameters are small.

16. The method of claim 15 further comprising selecting parameter updating schemes for the selected operating parameters based on the one or more physical dimensions including memory hole diameter.

17. The method of claim 16 further comprising selecting a first parameter updating scheme for the first physical level and a second parameter updating scheme for the second physical level, the second parameter updating scheme changing the operating parameters at a faster rate than the first parameter updating scheme.

18. The method of claim 11 further comprising, after a period of use, repeating testing of the memory cells at the plurality of physical levels in the three-dimensional NAND memory to obtain post-use characterization information.

19. A three-dimensional nonvolatile NAND memory comprising:

a three-dimensional array of nonvolatile memory cells formed in a plurality of physical levels disposed above a substrate;

a plurality of memory hole structures extending vertically through the plurality of physical levels to connect memory cells of the plurality of physical levels in NAND strings;

a write circuit on the substrate that is configured to write sample data to sample word lines at different physical levels of the plurality of physical levels using a sequence of write and verify steps;

a characterization circuit on the substrate that is configured to receive information regarding the writing of sample data to sample word lines from the write circuit, the characterization circuit configured to determine memory hole diameter of a memory hole structure at the different physical levels from the information; and a parameter selecting circuit that selects write parameters for write operations on different physical levels of the plurality of physical levels based on the memory hole diameter of the memory hole structure at the different physical levels.

20. A method of operating a three-dimensional nonvolatile NAND memory formed in two or more physical levels of memory cells disposed above a substrate comprising:

testing memory cells at a plurality of the physical levels in the three-dimensional NAND memory to obtain characterization information for each of the plurality of physical levels;

calculating memory hole diameter at each of the plurality of physical levels from the characterization information; and calculating at least one initial value of a write parameter for each of the plurality of physical levels, the initial value of the write parameter for an individual physical level calculated from the memory hole diameter calculated for the individual physical level.

\* \* \* \* \*